United States Patent [19]

Lien

[11] Patent Number: 5,470,766
[45] Date of Patent: Nov. 28, 1995

[54] EFFICIENT METHOD FOR FABRICATING OPTIMAL BICMOS N-WELLS FOR BIPOLAR AND FIELD EFFECT TRANSISTORS

[75] Inventor: Chuen-Der Lien, Mountain View, Calif.

[73] Assignee: Integrated Devices Technology, Inc., Santa Clara, Calif.

[21] Appl. No.: 254,817

[22] Filed: Jun. 6, 1994

[51] Int. Cl.$^6$ ............ H01L 21/265; H01L 21/70; H01L 27/00; H01L 21/302
[52] U.S. Cl. .............. 437/31; 437/57; 437/59; 437/74
[58] Field of Search .............. 437/31, 57, 59, 437/74

[56] References Cited

U.S. PATENT DOCUMENTS

| | | | |
|---|---|---|---|
| 4,032,372 | 6/1977 | Vora | 437/74 |
| 4,969,823 | 11/1990 | Lepham et al. | 437/74 |
| 5,013,671 | 5/1991 | Havemann | 437/31 |
| 5,023,193 | 6/1991 | Manoliu et al. | 437/57 |
| 5,091,322 | 2/1992 | Maeda et al. | 437/31 |
| 5,102,811 | 4/1992 | Scott | 437/31 |
| 5,132,235 | 7/1992 | Williams et al. | 437/31 |
| 5,330,922 | 7/1994 | Erdeljac et al. | 437/59 |

OTHER PUBLICATIONS

Hayden, J. D., et al., "A High–Performance Quadruple Well, Quadruple Poly BiCMOS Process for Fast 16Mb SRAMs", *1992 IEEE*, Dec. 13–16, 1992, IEDM 92–819, pp. 32.6.1–32.6.4.

Wolf, Stanley, "Silicon Processing for the VLSI Era", vol. 2: Process Integration, Long Beach, Calif., published, Lattice Press, 1990.

*Primary Examiner*—Olik Chaudhuri
*Assistant Examiner*—Brian K. Dutton
*Attorney, Agent, or Firm*—Skjerven, Morrill, MacPherson, Franklin & Friel; Edward C. Kwok

[57] ABSTRACT

A BiCMOS process is provided for fabricating on the same semiconductor substrate three types of N-wells optimized respectively for (i) PMOS FETs requiring low P+/N-well capacitance; (ii) NPN bipolar transistors which do not require low collector-to-substrate capacitance and PMOS FETs which require latch-up immunity; and (iii) NPN bipolar transistors which require low collector-to-substrate capacitance.

9 Claims, 10 Drawing Sheets

EFFICIENT METHOD FOR FABRICATING OPTIMAL BICMOS N-WELLS FOR BIPOLAR AND FIELD EFFECT TRANSISTORS

BACKGROUND OF THE INVENTION

1. Field of the Invention

This invention relates to bipolar-CMOS (BiCMOS) semiconductor devices. More particularly, this invention relates to an efficient method for fabricating N-wells with structures optimized for both PMOS field effect transistors (FETs) and NPN bipolar transistors in a BiCMOS device.

2. Description of the Related Art

Early BiCMOS integrated circuits (ICs) were designed with predominantly CMOS logic gates and a relatively small number of bipolar input/output (I/O) drivers which sole function was to provide adequate drive currents for external interfaces. At that time, processes were optimized for CMOS FETs, even to the detriment of bipolar transistor performance. Optimization for CMOS FETs was reasonable because the small number of non-optimal bipolar I/O transistors did not significantly degrade the overall IC performance. Because of the speed and drive abilities of the bipolar transistors, early BiCMOS ICs offered an overall performance improvement over CMOS-only ICs.

Figure 1:
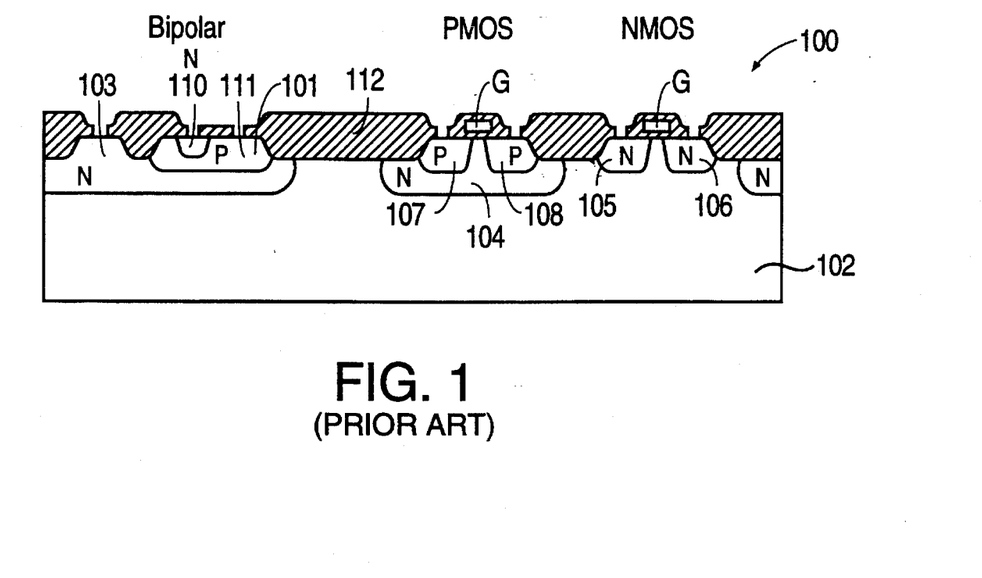
FIG. 1 is a cross-sectional view of an prior art BiCMOS structure using a P-type substrate which adds one masking step to the standard CMOS process.

In a typical early BiCMOS circuit, bipolar transistors were fabricated by piggybacking bipolar process steps on as many CMOS fabrication steps as possible, so as to minimize the total number of fabrication steps. FIG. 1 shows a cross-sectional view of an early BiCMOS structure 100 using a P-type substrate 102. The process which produced structure 100 differs only from a conventional CMOS process by including an additional masking step. This additional masking step selectively produces lightly doped P-regions, such as P-region 101, which serve as the bases of NPN bipolar transistors. N-type bipolar collector regions, such as collector region 103, are formed by the same process step as that used to form CMOS N-well 104. Contacts for CMOS source and drain regions (e.g. regions 105–108) are also formed in the same step as contacts to the emitter, collector and base regions (e.g. regions 110, 103 and 111) of the bipolar transistors. Finally, semi-recessed local oxidation of silicon (LOCOS), such as oxide layer 112, isolates both the CMOS FETs and bipolar transistors.

Figure 2:
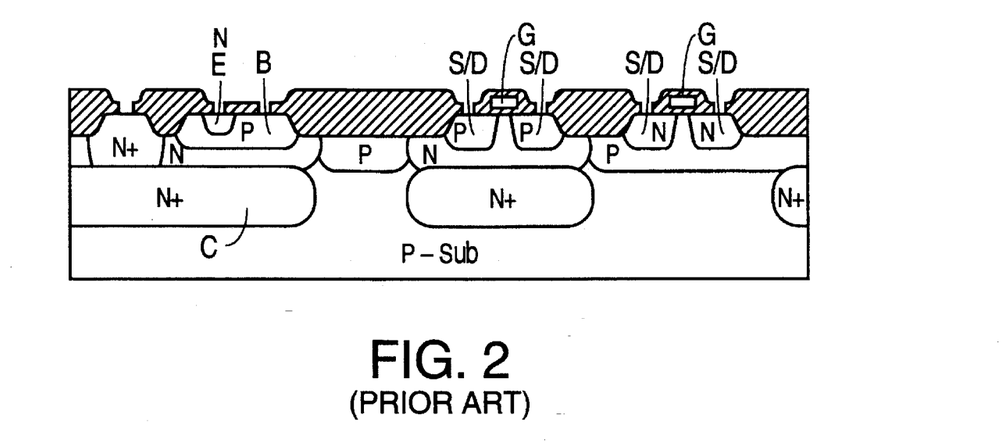
FIG. 2 is a cross sectional view of a conventional SBC BiCMOS structure.
Figure 3:
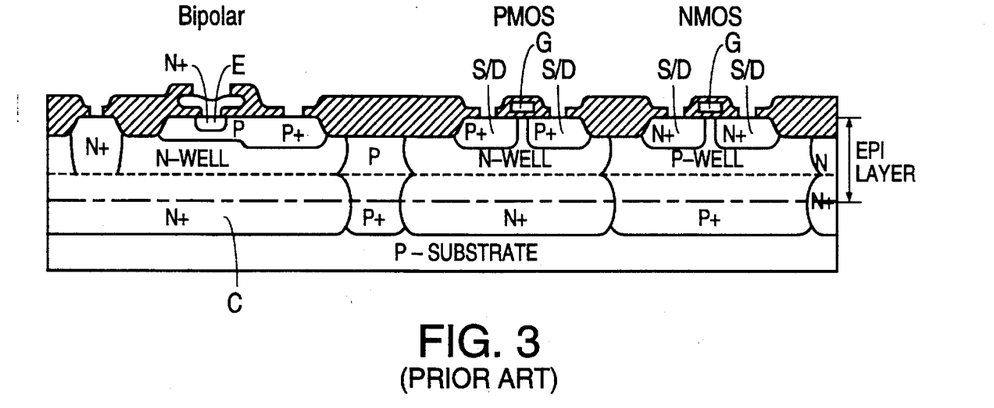
FIG. 3 is cross-sectional view of a structure fabricated under a prior art modified twin-well BiCMOS process.

More recently, higher performance BiCMOS processes have been developed to improve bipolar performance in the resulting devices. However, optimizing both bipolar and CMOS transistors typically requires several additional process steps. Two such higher performance conventional processes are the standard buried-collector (SBC) BiCMOS process and the modified twin-well BiCMOS process. FIGS. 2 and 3 are cross-sectional views of structures fabricated under the SBC and the modified twin-well BiCMOS processes, respectively.

While the SBC process is simpler than the modified twin-well process, i.e., three additional masking steps versus four additional masking steps, performance of bipolar transistors fabricated under the SBC process is lower than corresponding transistors fabricated under a twin-well process for two reasons. First, the packing density (i.e. the spacing between collectors of two adjacent bipolar transistors) is limited by a need to avoid the punchthrough phenomenon, which can occur due to the lightly doped P-substrate. Although higher packing density can be achieved by increasing the doping level in to the P-substrate, increasing the doping level in the P-substrate increases the collector-to-substrate capacitance ($C_{CS}$). Second, in the SBC process, an N-type epitaxial layer is used, which is counterdoped for N-well isolation, and for forming P-wells. Such counterdoping in the epitaxial layer results in both processing problems and mobility degradation in the NMOS transistors. For such reasons, the modified twin-well process is more widely used than the SBC process.

Figure 4:
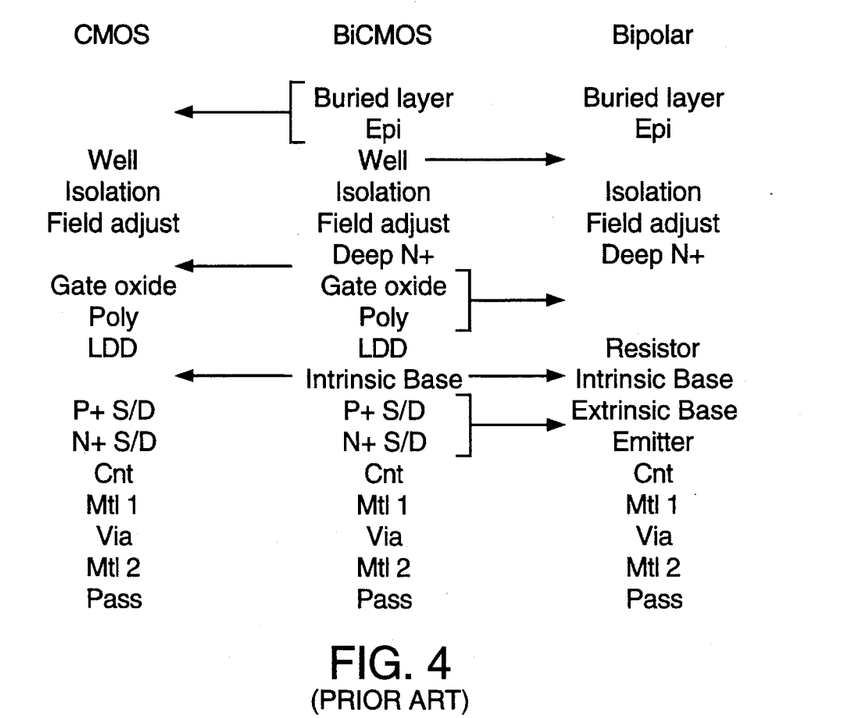
FIG. 4 is a process flow of the prior art modified twin-well BiCMOS process.

FIG. 4 shows a typical process flow under the modified twin-well BiCMOS process, illustrated with reference to conventional CMOS and bipolar processes. The arrows in FIG. 4 indicate when the modified twin-well BiCMOS process steps are performed relative to the corresponding conventional CMOS and bipolar process steps.

In the modified twin-well process, design trade-offs include balancing the characteristics of the epitaxial layer and well profiles. A bipolar transistor requires a minimum epitaxial thickness ($t_{epi(min)}$), which is determined by the bipolar breakdown voltage ($BV_{CEO}$), $C_{CS}$, base-to-collector capacitance ($C_{BC}$) and process controllability. If the epitaxial layer is too thick, both the drive-current capability and the cut-off frequency ($f_T$) of a resulting bipolar transistor diminish, while the collector resistance ($R_C$) of such a bipolar transistor increases, resulting in an overall drop in drive-current capability. The ability to control the thickness of an epitaxial layer is limited by the heat-anneal cycles required in the formations of the collector and P isolation regions.

However, in the modified twin-well process, the use of P-buried layers to isolate adjacent N-wells dictates that the epitaxial layer be at least thick enough to prevent excessive increases, due to upward diffusion of the P+ buried layers, in (i) the NMOS body-effect coefficient, due to high doping in the substrate, and (ii) the junction capacitance between the N+ source and drain regions and the P-well. Thus, under the modified twin-well process, to decouple the NMOS parameters from the P-buried layer parameters, the doping of the P-buried layers is kept low and the epitaxial layer is made sufficiently thick.

Since both NPN bipolar transistors and PMOS FETs are fabricated within N-wells, the N-well profile is designed to accommodate a number of factors. For example, to prevent the Kirk effect in the bipolar transistors, the portion of an N-well below the base and above the buried collector is preferably heavily doped. (The Kirk effect is the "base push-out" effect, which results in reduced current gain at higher collector currents.) At the same time, the N-well doping is also required to be light enough to provide adequate $BV_{CEO}$ and $BV_{CES}$.

CMOS FETs have N-well requirements that are different from, and sometimes competing with, the N-well requirements of the bipolar transistors. The N-well requirements for FETs include optimized threshold voltage ($V_T$), punch-through voltage, source/drain junction capacitance, and body effect. Typically, a blanket P-implant provides the desired $V_T$ for PMOS FETs, using a doping level high enough to prevent punchthrough and yet low enough to minimize the source/drain capacitance and body effect.

Figure 5A:
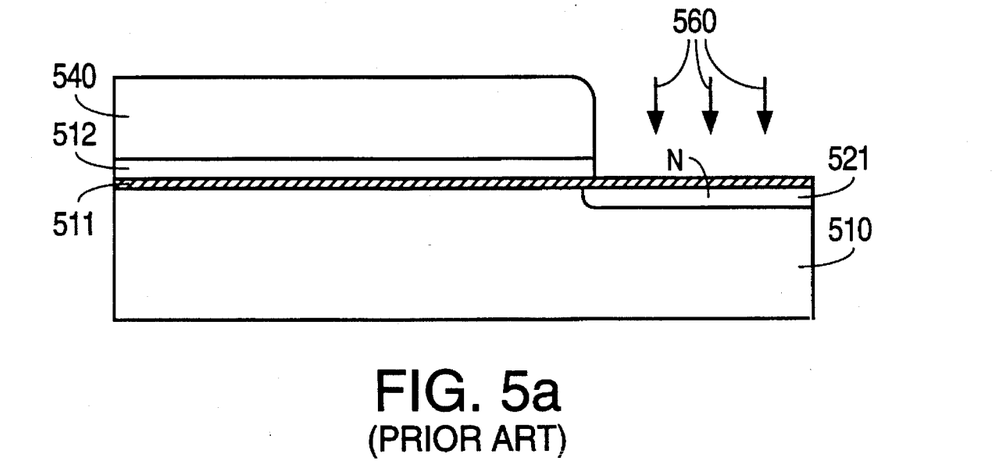
FIGS. 5a–5d are cross-sectional views of a BiCMOS structure in various stages of fabrication, under a prior art modified twin-well BiCMOS process.

FIGS. 5a–5d are cross-sectional views of a prior art BiCMOS structure during various stages of fabrication under a modified twin-well BiCMOS process. In FIGS. 5a–5d, the same N-well is used for both PMOS FETs and NPN bipolar transistors. In FIG. 5a, a wafer having a P-type substrate 510 has a thin pad oxide layer 511 formed on one surface, and a thicker overlying nitride layer 512 formed on top of the pad oxide layer 511.

Figure 5B:
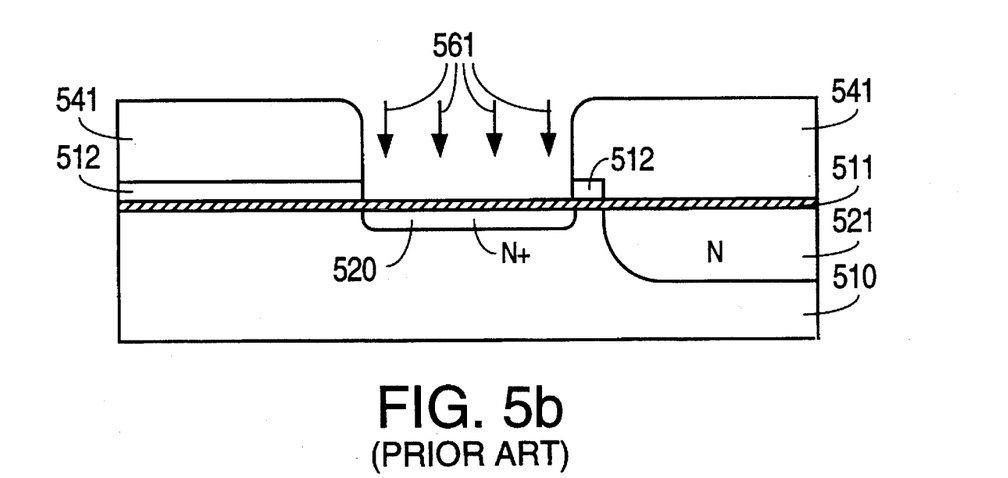

A first photoresist mask 540 is used to define deep N-well regions. Using photoresist mask 540, nitride layer 512 is etched to expose the pad oxide 511 layer. Then, an N-type ion implant step, indicated by reference numeral 560, is performed using a suitable dopant such as phosphorus, to form an N region 521. As shown in FIG. 5b, Photoresist mask 540 is then removed and a second photoresist mask, N+ buried layer mask 541, is used to define regions for implanting N+ buried layers. An etching step removes the exposed portions of nitride layer 512 to expose pad oxide layer 511. A suitable N-type dopant, such as arsenic, is used in an ion-implantation step, indicated by reference numeral 561, to form N+ region 520. During the steps shown in FIG. 5b, N region 521 diffuses deeper into the P substrate 510.

Figure 5C:
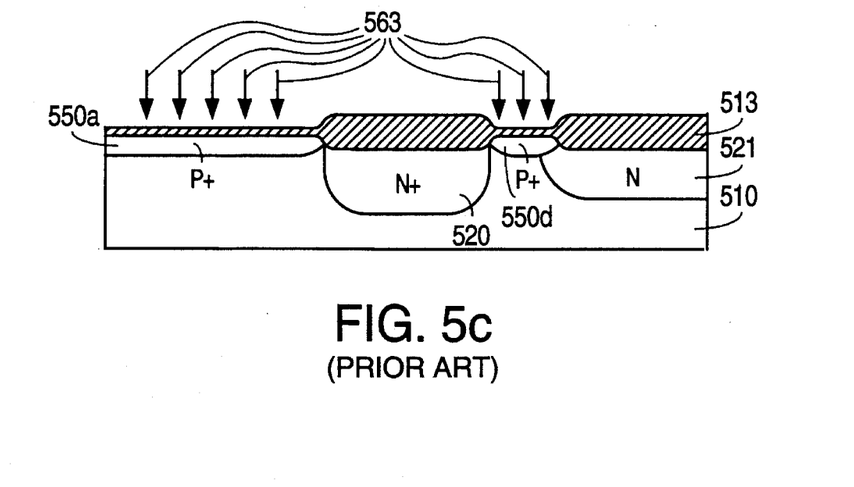

After photoresist 541 is removed, an anneal step and a LOCOS field oxide formation step are performed to from LOCOS oxide layer 513, which is used to isolate the active regions. Prior to forming the LOCOS field oxide, an optional channel stop implant can be provided, if desired. After LOCOS field oxide 513 is formed, the remaining portions of nitride layer 512 is removed. The anneal step repairs the crystal lattice damage resulting from the previous implant steps and also serves to drive N region 521 and N+ region 520 deeper into substrate 510. Using LOCOS field oxide layer 513 as a mask, a high dose blanket P-type implant step, represented by reference numeral 563, is performed to form P+ regions 550a and 550d, as shown in FIG. 5c.

Figure 5D:
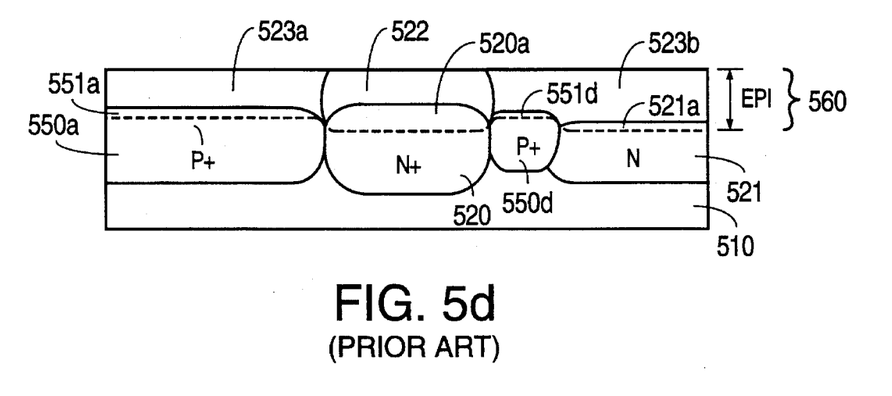

Next, both LOCOS field oxide layer 513 and pad oxide layer 511 are removed. A P-type epitaxial layer (EPI) 560 is then grown over the entire surface of the wafer. During the formation of epitaxial layer, the implanted N-type and P-type dopants diffuse deeper into substrate 510, and also diffuse upward into the epitaxial layer 560 as indicated in FIG. 5d by regions 551a, 520a, 551d and 521a, respectively. At this point, P+ region 550a, N+ region 520 and N region 521 have become P+ buried region 550a, N+ buried region 520 and deep N well 521, by virtue of their positions beneath the EPI layer 560. The extents of the downward and upward diffusions depend on the relative dopant densities of the adjoining regions at their respective interfaces. The final step to achieve the structure shown in FIG. 5d is the fabrication of an N-well 522 in the epitaxial layer by either a diffusion, or another N-type ion implantation and anneal step, using a third photoresist mask. Regions 523a and 523b of P-type epitaxial layer 560 isolate N-well 522 from other similarly created N-wells. Hence, in the prior art process described above, a total of three photoresist masks are needed to form N-well 522 and N+ buried layer 520, 520a.

Having completed the N-wells for the NPN bipolar transistors and PMOS FETs, conventional fabrication steps can then be used to form the collector, base, emitter and contacts for the bipolar transistors, and the source, gate, drain and contacts for the PMOS FETs.

Figure 6:
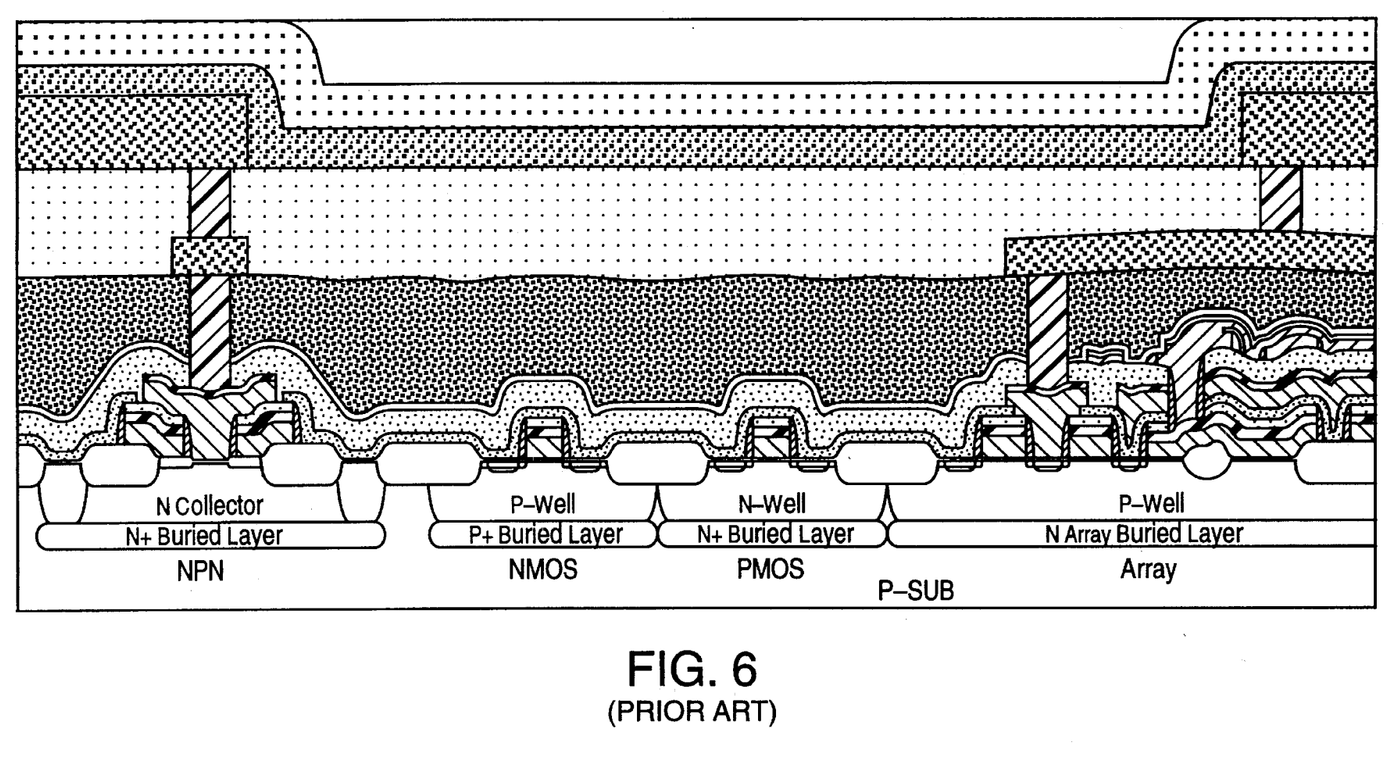
FIG. 6 is a schematic cross-sectional view of structure fabricated under a prior art quadruple well, quadruple polysilicon BiCMOS process.

The article "A High-Performance Quadruple Well, Quadruple Poly BiCMOS Process for Fast 16 Mb SRAMs" by J. D. Hayden et al., IEDM 92, pp. 819–822, discloses the use of different buried layers having different well implants to form four distinct well regions: NPN bipolar, PMOS, peripheral NMOS, and array. FIG. 6 is a schematic cross-sectional view of a structure fabricated by such a quadruple well, quadruple polysilicon BiCMOS process. The array buried layer is added to achieve a low soft-error rate. The N-wells and the collector regions are physically separated in order to meet CMOS punchthrough and bipolar breakdown requirements.

Although the more recent BiCMOS processes described above are improvements over the early BiCMOS process, all the above described prior art BiCMOS processes share a number of common characteristics. First, in each of these processes, PMOS FETs and NPN bipolar transistors share the same type of N-well structure. Second, the N+ buried layer below the N-wells (e.g. N+ buried layer 520 of FIG. 5d) is in electrical contact with the P+ buried layer below the P-well (e.g. P+ buried layer 550a), which is grounded via the P-type substrate. Third, an additional isolating deep N-well, necessitating an additional masking step, is required under a P-well whenever a special NMOS FET is needed, such as a memory cell or in an electrostatic discharge protection device. Fourth, defining both the N+ buried layer and the P+ buried layer also requires an additional masking step. Generally, the P+ buried layer is implanted either in a blanket fashion or is self-aligned to the N+ buried layer.

As a result, BiCMOS ICs fabricated using the above described prior art processes have at least two disadvantages. First, because a thin epitaxial layer is used to achieve faster bipolar transistors, PMOS FETs suffer from high P+/N-well capacitance. Second, because the P+ buried layer and the N+ buried layers are electrically connected, the bipolar transistors suffer from high collector-to-substrate capacitance ($C_{CS}$).

Thus, the prior art fails to provide a single type of N-well structure which is optimized for both FETs and bipolar transistors. Accordingly, there is a need for fabricating N-wells or P-wells with differing parameters and hence characteristics so as to better optimize both bipolar transistors and FETs. Further, such process should preferably be achieved without further increasing the number of masking steps.

SUMMARY OF THE INVENTION

In accordance with the invention, prior art difficulties arising from the inability to fabricate a single well type optimized for both FETs and bipolar transistors are overcome by fabricating different types of wells of a first conductivity type using a method that does not increase the number of necessary masking steps. These wells have the following features and advantages.

A first well of the first conductivity is fabricated for forming therein MOS transistors of a BiCMOS IC, with a deep well of the first conductivity formed under the MOS transistors. This first well allows a thin epitaxial layer of the first conductivity. Such a thin epitaxial layer is suitable for forming fast bipolar transistors. At the same time, the deep well does not increase the well-to-substrate capacitance, unlike a buried layer in electrical contact with the substrate.

The first well is formed by introducing a first dopant of the first conductivity type into a region along an exposed surface face of a lightly built substrate thereby forming a lower well portion. Next a lightly doped epitaxial layer of a second conductivity type is grown over the substrate. This is followed by the introduction of a second dopant of the first conductivity type through a region of the epitaxial layer, thereby forming an upper well portion. The upper and lower well portions have similar doping densities and form the first well.

A second well of the first conductivity has a highly doped buried layer formed beneath the thin epitaxial layer. This second well is provided for forming therein bipolar transistors. This second well is also used for forming therein MOS FETs that require high latch-up immunity.

The second well type is formed by first introducing a first dopant of the first conductivity type into a region along the upper surface of the substrate, thereby forming a lower well portion. Next a dopant of the first conductivity type, having a higher density than the density of the first dopant in the first region is introduced into a region along the exposed surface of the substrate, thereby forming a middle well portion which is disposed over the lower well portion. Subsequently, a lightly built epitaxial layer of a second conductivity type is grown over the semiconductor body, i.e. substrate. Next, a second dopant of the first conductivity type is introduced through a region of the epitaxial layer thereby forming an upper well portion. The upper, middle and lower well portions form the well with the middle portion situated between the upper and lower well portions. In the case of the second well type, the middle well portion completely separates the upper and lower well portions.

A third well type is provided for forming therein bipolar transistors requiring low collector-to-substrate capacitance. In this third well, a highly doped buried layer of the first conductivity type is enclosed by a deep well and the thin epitaxial layer so that the buried layer has improved electrical isolation from the substrate.

The process steps for forming the third well type is similar to that described the second well type, except that the middle well portion does not totally separate the upper and lower well portions. In other words, the upper and lower well portions form a structure completely enclosing the middle well portion.

DETAILED DESCRIPTION OF THE PREFERRED EMBODIMENTS

FIGS. 7a–7d illustrate how three different types of optimized N-wells can be fabricated in accordance with the present invention. To provide an N-type structure, such as an N-well, phosphorus, arsenic and antimony can each be used as a dopant. To provide a P-type structure, boron is the most common dopant. In the ion implantation steps described below, each of these elements is preferably implanted in its singly ionized form. After implantation, various annealing steps are used to repair implant lattice damage, to activate the implanted species, and to drive diffusion of the implanted species. The depths to which the implanted species diffuse depend on the species type and the values of the anneal parameters. Alternatively, one of ordinary skill in the art will appreciate that ion implantation steps can be replaced by diffusion steps.

In the following description, well-known photoresist masking, etching and cleaning techniques are also used in the simultaneous fabrication of the three types of N-wells. Hence, detailed descriptions of well-known steps and other conventional semiconductor fabrication steps are omitted from this disclosure to simplify the discussion. Similarly, listings of well-known dosage and parametric values for these steps are also omitted.

The method described below uses only three photoresist masks for the simultaneous fabrications of three different N-wells in a BiCMOS process, thereby achieving optimal performances in both the bipolar and the CMOS transistors, while using a minimum number of steps.

Figure 7A:
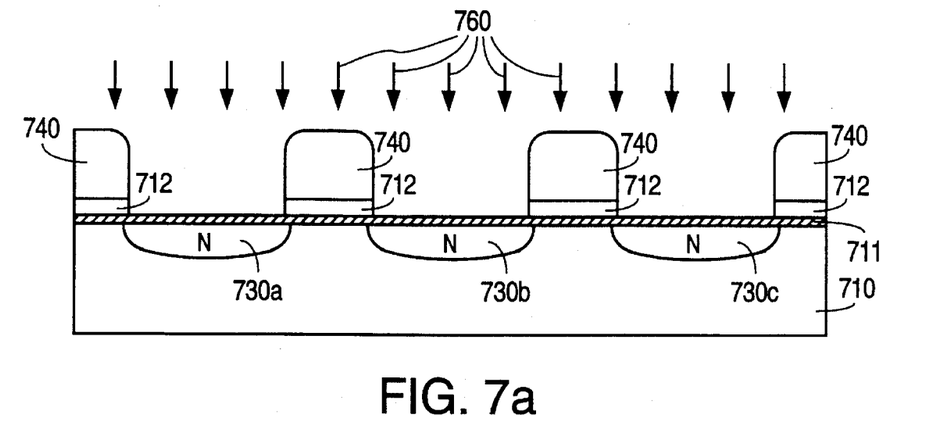
FIGS. 7a–7f are cross-sectional views of a structure in various stages of fabrication under a triple N-well process in accordance with the invention.
Figure 7B:
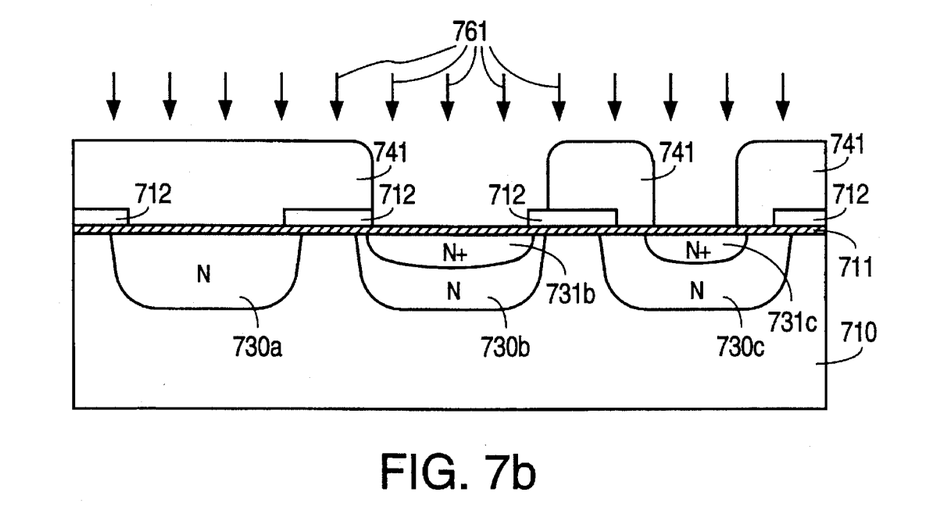
Figure 7C:
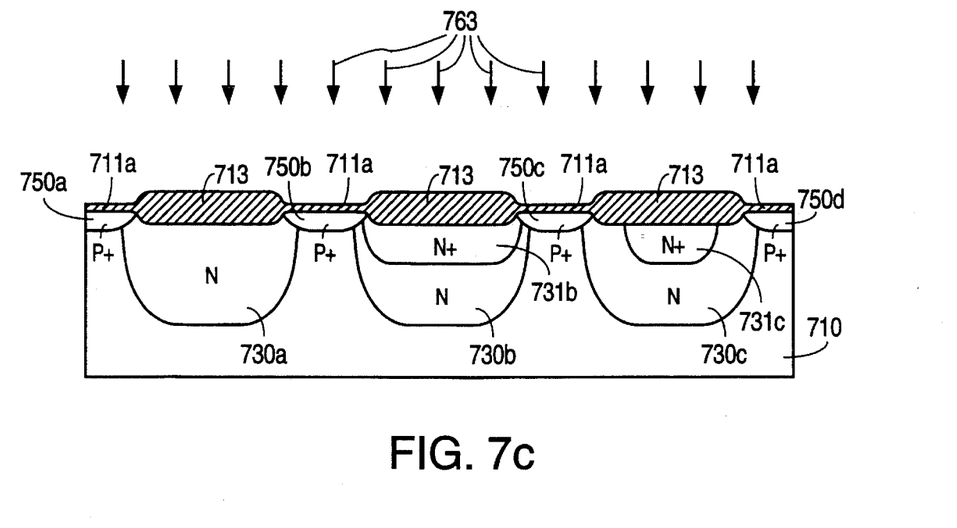
Figure 7D:
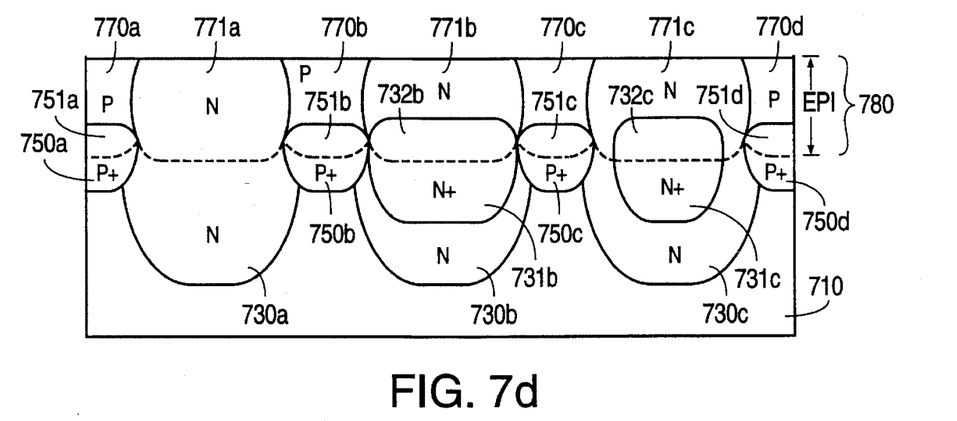

FIGS. 7a–7d are cross-sectional views illustrating one embodiment of the present invention having three different types of N-wells. These three different types of N-wells, represented by N-wells 771a, 771b, 771c in FIG. 7d, are optimized respectively for (i) PMOS FETs requiring low P+/N-well capacitance; (ii) NPN bipolar transistors which do not require low collector-to-substrate capacitance ($C_{CS}$) and PMOS FETs which require latch-up immunity; and (iii) NPN bipolar transistors which require low $C_{CS}$.

Referring to FIG. 7a, the fabrication of the triple N-well structure of the present invention begins with the deposition of a 350 Å thick silicon oxide layer 711 and a 1500 Å thick silicon nitride layer 712 on a wafer having a P-type monocrystalline silicon substrate 710, using conventional techniques. A first photoresist mask 740 is then used to define areas exposing silicon nitride layer 712 for implanting N-well regions 730a, 730b, and 730c. Since N-well regions 730a, 730b and 730c are developed into deep N-wells in subsequent process steps, N-well regions 730a, 730b and 730c are hereafter referred to as "deep N-wells" 730a, 730b and 730c. Deep N-wells 730a, 730b and 730c are formed by removing the exposed portions of nitride layer 712. An N-type ion implantation step, represented by reference numeral 760, creates the deep N-wells 730a, 730b and 730c structures shown in FIG. 7a, using an N-type dopant, such as phosphorus, and conventional ion implantation techniques.

After photoresist mask 740 is stripped and the wafer annealed at 1150° C. for 6 hours, a second photoresist mask 741 (FIG. 7b) is formed to define a N+ buried layer. As shown in FIG. 7b, photoresist mask 741 covers first deep N-well 730a, exposes substantially all second deep N-well 730b, and exposes a central portion of third deep N-well 730c. An N-type ion implantation step, represented by reference numeral 761, is then performed using a suitable N+ dopant, such as arsenic, implanted at a dosage of $5 \times 10^{15}$ at 150 KeV, to form N+ regions 731b and 731c. Since regions 731b and 731c would become buried layers by operation of later process steps, regions 731b and 731c are referred to as N+ buried layers 731b and 731c. The wafer is then subjected to an annealing step at 1100° C. for one hour, driving both implanted deep N-wells 730a, 730b and 730c, and N+ buried layers 731b and 731c further into substrate 710. The structure formed thus far is shown in FIG. 7b.

Next, photoresist mask 741 is stripped. Referring to FIG.

7c, using the remaining portions of nitride layer 712 as a mask, a LOCOS field oxide layer 713, approximately 6000 Å thick, is formed using conventional techniques over the exposed regions of substrate 710 not protected by nitride layer 712. Then, the remaining portions of nitride layer 712 are stripped, and a blanket P+ ion implantation step, represented by reference numeral 763, is performed. Ion implantation step 763 can be performed using boron at a dosage of $1\times10^{13}$ Cm$^{-2}$ at 50 KeV. In ion implantation step 763, LOCOS oxide 713 serves as a self-aligning mask, thereby forming regions 750a, 750b, 750c and 750d below the relatively thin (350 Å) pad oxide layer 711a. As regions 750a, 750b, 730c and 750d would become P+ buried layers by operation of subsequent process steps, these regions are referred in the remaining of this detailed description as P+ buried layers 750a, 750b, 750c and 750d respectively. P+ buried-layers 750a, 750b, 750c and 750d serve as isolation regions between deep N-wells. FIG. 7c shows P+ buried layers 750b and 750c serving as isolation regions between deep N-wells 730a and 730b, and between deep N-wells 730b and 730c, respectively.

Thin oxide layer 711a and LOCOS oxide layer 713 are then completely removed using a suitable etchant. Thereafter, as shown in FIG. 7d, a P-type epitaxial layer 780 is grown over the entire surface of the wafer using conventional techniques. The elevated temperature used for growing the epitaxial layer 780 also drives deep N-wells 730a, 730b, and 730c, N+ buried layers 731b and 731c, and P+ buried layers 750a, 750b, 750c and 750d deeper into substrate 710. At the same time, as the P-type epitaxial layer 780 is growing, the dopants in N+ buried layers 731b and 731c, and P+ buried layers 750a, 750b, 750c and 750d diffuse (under the elevated temperature) upwards into the growing epitaxial layer 780, resulting in the formation of N+ epitaxial regions 732b and 732c, and P+ epitaxial regions 751a, 751b, 751c and 751d as shown in FIG. 7d.

Finally, the triple N-wells are completed by introducing, using a photoresist mask 790 (not shown), N-type dopant into epitaxial layer 780 to form N-regions 771a, 771b and 771c. P-regions 770a, 770b, 770c, and 770d of P-type epitaxial layer 780 isolate N-regions 771a, 771b and 771c from adjacent N-regions. In summary, the above-described process flow for fabricating the three optimized N-wells 771a, 771b and 771c requires two photoresist masks for forming the deep N wells and N+ buried layers (i.e. photoresist masks 740 and 741), a self-aligned LOCOS masking step for forming the P+ buried layers, and a final photoresist mask (i.e. photoresist mask 790) for forming the triple N wells.

Having completed the N-wells and buried layers for the NPN bipolar and PMOS transistors, well-known fabrication steps can then be used to form the collectors, the bases and the emitters of the bipolar transistors, the sources, the gates and the drains of the PMOS transistors, and their respective contacts. The NMOS transistors are formed in P epitaxial layer 780 outside of the N wells.

Figure 7E:
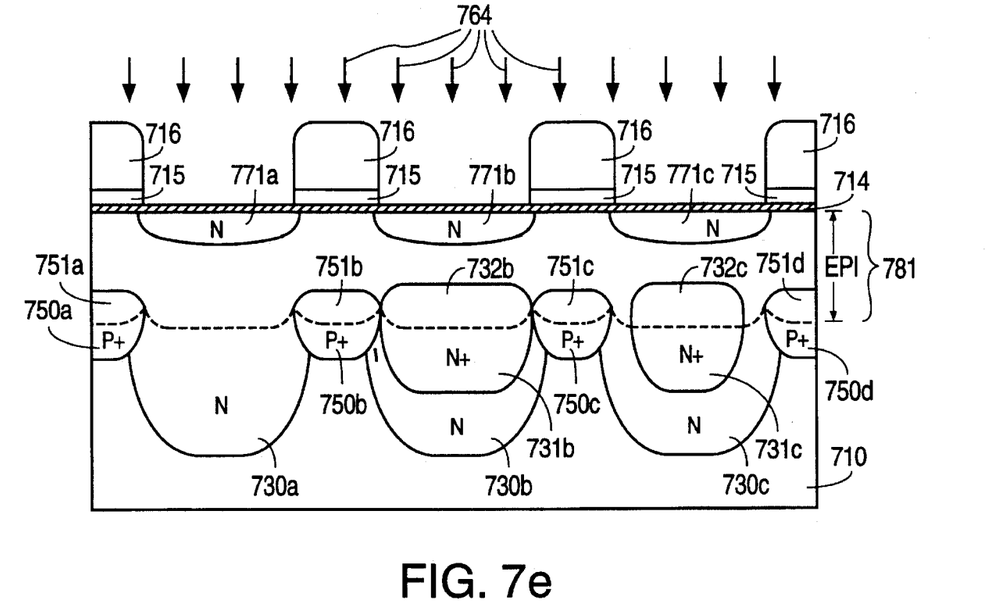

In a second embodiment of the present invention, a structure is first formed using process steps identical to the process steps described above up to and including the formation of P+ buried layers 750a, 750b, 750c and 750d in FIG. 7c. To avoid burdening this detailed description with repetition, the process steps up to FIG. 7c are not repeated. The next steps in this structure under the second embodiment of the present invention following formation of P+ buried layers 750a, 750b, 750c and 750d are now discussed with reference to FIG. 7e. As shown in FIG. 7e, a very lightly doped P or N type epitaxial layer (EPI) 781 is grown over the entire surface of the wafer. As in the first embodiment discussed above, the thermal cycle associated with the formation of epitaxial layer 781 also drives deep N-wells 730a, 730b and 730c, N+ buried layers 731b and 731c and the P+ buried layers 750a, 750b, 750c and 750d deeper into substrate 710. At the same time, as epitaxial layer 781 is growing, the high dopant concentrations of the N+ buried layers 731b and 731c, and the P+ buried layers 750a, 750b, 750c and 750d cause the exposed highly doped P+ and N+ buried layers to diffuse upwards into growing epitaxial layer 781, resulting in the formation of N+ epitaxial regions 732b, and 732c, and P+ epitaxial regions 751a, 751b, 751c and 751d.

Next, using conventional techniques, a thin oxide layer 714 and a nitride layer 715 are deposited in succession over the entire epitaxial layer 781. A third photoresist mask 716 is then provided to define N-well regions to be formed. Such N-well regions to be formed are indicated by N-well regions 771a, 771b and 771c. The portions of nitride layer 715 exposed in the openings of photoresist mask 716 are then removed in an etching step. N regions 771a, 771b and 771c are then formed by implanting the exposed regions of epitaxial layer 781 with a suitable N-type species. This ion implantation step is indicated generally by reference numeral 764.

Figure 7F:
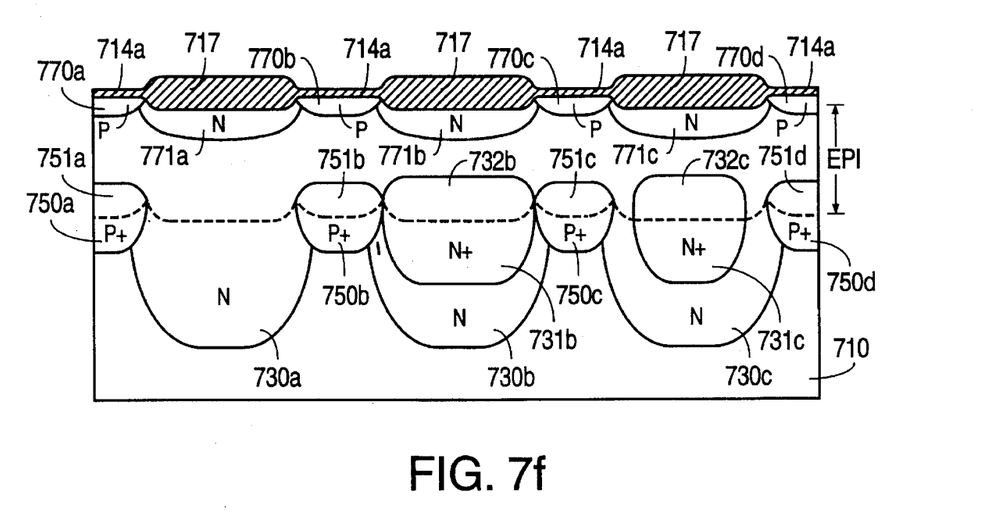

Referring now to FIG. 7f, after the N ion implantation step 764, photoresist mask 716 is removed. Then, a LOCOS oxide pattern 717 is formed over the exposed regions, i.e. over all three N-type regions 771a, 771b, and 771c. The remaining nitride layer 715 is then stripped, and a blanket P ion implantation is performed through the remaining thin oxide layer 714a, with newly formed LOCOS oxide layer 716 functioning as a self-aligned mask. This P type ion implantation step results in the formation of P-type isolation regions 770a, 770b, 770c, and 770d.

Next, both LOCOS field oxide layer 717 and thin oxide layer 714a are removed using conventional techniques. The wafer is then subject to an annealing step to drive N+ implanted regions 771a, 771b and 771c deeper into the epitaxial layer to merge with the respective N and N+ regions 730a, 732b, 730c and 732c to form three N-wells with different characteristics. The resulting structure is the same as the structure shown in FIG. 7d. Simultaneously, P isolation regions 770a, 770b, 770c, and 770d are also driven deeper into the epitaxial layer to merge with buried P+ regions 751a, 751b, 751c and 751d.

Figure 8:
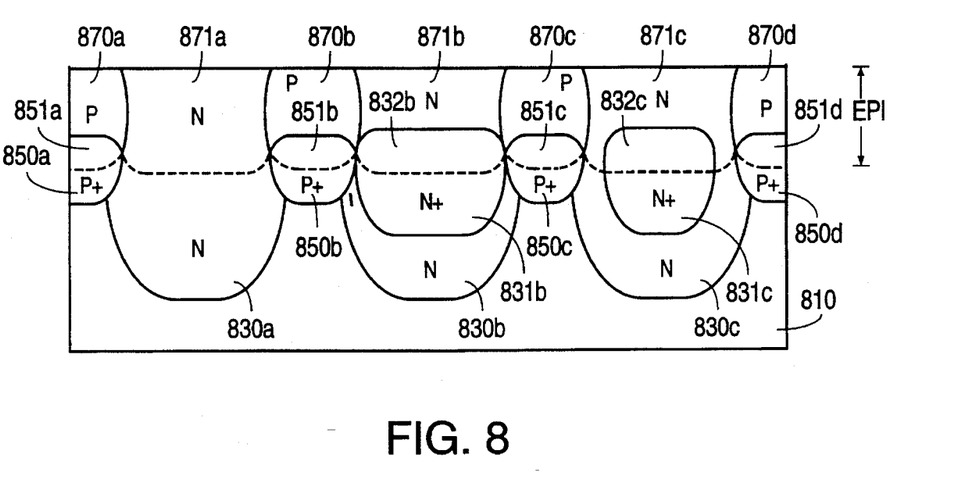
FIG. 8 is a cross-sectional view of a structure fabricated under another embodiment of the triple N-well process of the present invention.

FIG. 8 shows a structure fabricated by a third embodiment of the present invention, in which the epitaxial layer is N-type, with P regions 870a, 870b, 870c and 870d and P+ buried regions 850a, 850b, 850c and 850d forming isolation regions around N regions 871a, 871b and 871c above the N buried regions 830a, 830b and 830c. N+ buried layers 831b and 831c are disposed above N buried regions 830b and 830c. The N regions 871a, 871b and 971c forms three different types of N-wells. The process steps for fabricating these N-wells in this third embodiment is substantially the same as the corresponding steps in the second embodiment up to the formation of P+ buried layers 850a, 850b, 850c and 850d, which correspond to P+ buried layers 750a, 750b, 750c, and 750d shown in FIG. 7c. Subsequent to the formation of P+ buried layers 850a, 850b, 850c and 850d, a lightly-doped epitaxial layer 860 of either P-type or N-type is formed. Then, a photoresist mask is deposited for an ion implantation step using P-type species, which results in P regions 870a, 870b, 870c and 870d. Using the same photoresist mask, a LOCOS oxide layer is formed over P regions 870a, 870b, 870c and 870d as a self-aligned mask. Subsequently, an ion implantation step using N-type species implants through the thin oxide layer to form the respective triple N-wells 871a, 871b and 871c. Next, the LOCOS oxide layer and the thin oxide layer are removed using conventional techniques. The wafer is then subject to an annealing step to drive N+ implanted regions 871a, 871b and 871c deeper into the epitaxial layer to merge with the respective N and N+ regions 830a, 832b, 830c and 832c to form three N-wells with different characteristics. The resulting structure is the same as the structure shown in FIG. 7d. Simultaneously, P isolation regions 870a, 870b, 870c, and 870d are also driven deeper into the epitaxial layer to merge with buried P+ regions 851a, 851b, 851c and 851d. In essence, the third embodiment differs from the second embodiment by having the LOCOS oxide mask formed over the isolation regions 870a, 870b, 870c, and 870d, rather than the N-well regions 771a, 771b and 771c, as provided in the second embodiment shown in FIG. 7f.

Figure 9A:
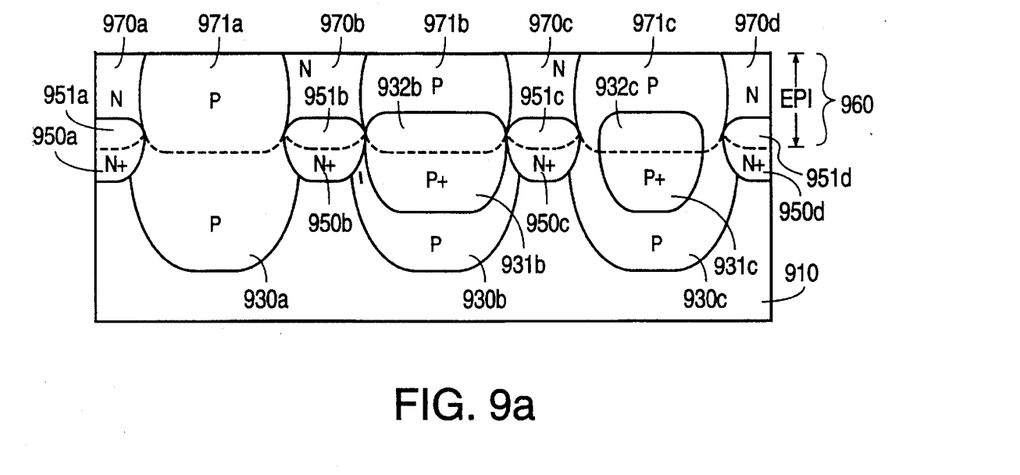
FIGS. 9a and 9b are cross-sectional views of structures under two embodiments of the triple P-well process of the invention.

In a fourth embodiment of the present invention, which pertains to the structure shown in FIG. 9a, substrate 910 is a lightly doped N-type monocrystalline substrate, with deep P-wells 930a, 930b, 930c formed within substrate 910. P+ buried layers 931b, 931c are disposed above deep P-wells 930b, 930c. P+ buried layers 932b and 932c are disposed above P+ buried layers 931b and 931c. Regions 951a, 951b, 951c and 951d correspond to regions 751a, 751b, 751c and 751d shown in FIG. 7d. An N-type epitaxial layer 960 is provided, with P-wells 971a, 971b, 971c formed over deep P-wells 930a, 930b, 930c for both NMOS FETs and PNP bipolar transistors. The process steps under this fourth embodiment is similar to the process steps described above with respect to the first embodiment, except that where an N-type (P-type) conductivity is provided in the first embodiment, either by ion implantation or diffusion, a P-type (N-type) species is provided in this fourth embodiment.

Figure 9B:
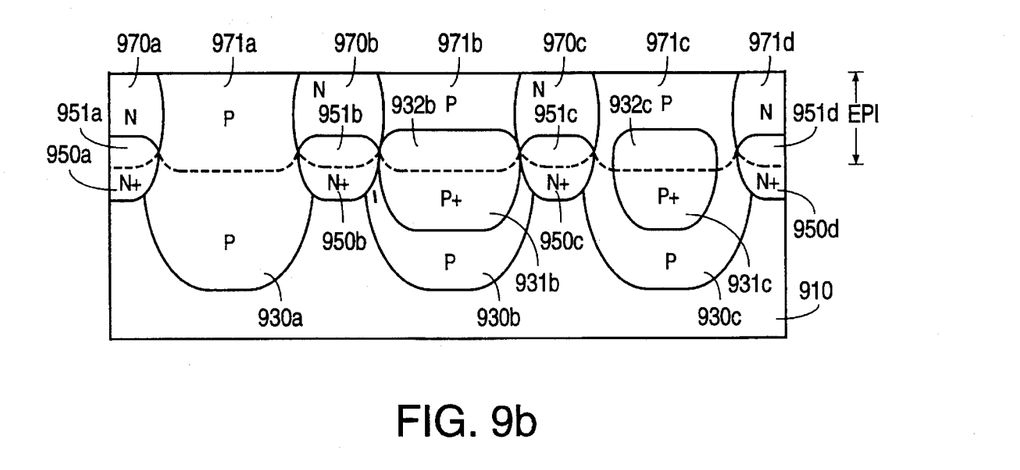

The structure shown in FIG. 9b can be fabricated in a fifth embodiment of the present invention using process steps similar either to the second embodiment or to the third embodiment, except that where an N-type (P-type) conductivity is provided in the second or third embodiment, either by ion implantation or diffusion, a P-type (N-type) species is provided in this fifth embodiment. The epitaxial layer 960 can be P-type with N-wells 970a, 970b, 970c, 970d and buried N+ layers 950a, 950b, 950c, 950d forming isolation regions for the P-wells 971a, 971b and 971c.

Although several embodiments have been described in detail, numerous modifications and variations will become apparent to those skilled in the art upon consideration of the above disclosure and the accompanying drawings. The above detailed description of the preferred embodiments is intended to be merely illustrative of the invention and should not be taken in a limiting sense. The scope of the claimed invention is defined only with reference to the following claims.

I claim:

1. A method for fabricating a well of a first conductivity type in a lightly doped monocrystalline semiconductor wafer, the method comprising the steps of:

introducing a first dopant of the first conductivity type from a surface of said lightly doped monocrystalline semiconductor wafer, into a first region along the surface of said lightly doped monocrystalline semiconductor wafer to achieve a first dopant concentration in said first region;

introducing a second dopant of the first conductivity type from the surface of said lightly doped monocrystalline semiconductor wafer to form a second region of said first conductivity type above said first region, said second region achieving a second dopant concentration higher than said first dopant concentration;

growing a lightly doped epitaxial layer over said surface of said lightly doped monocrystalline semiconductor wafer, such that said first and second regions become buried regions in said lightly dope monocrystalline semiconductor wafer; and introducing a third dopant of the first conductivity type from the surface of said lightly doped monocrystalline semiconductor wafer into said epitaxial layer to form a third region of said lightly doped monocrystalline semiconductor wafer above said buried regions.

2. The method of claim 1 wherein said first and third regions form a structure completely enclosing said second region.

3. The method of claim 1, wherein said epitaxial layer is of a second conductivity type, said second conductivity type being different from said first conductivity type.

4. The method of claim 1, wherein said first, second and third regions form said well of first said conductivity type, said method further comprising the step of isolating said well from other similar wells by regions of a second conductivity type, achieving a third dopant concentration, in said epitaxial layer.

5. The method of claim 4, further comprising the step of creating, prior to growing said epitaxial layer, regions of said second conductivity type, achieving a fourth dopant concentration, in said lightly doped monocrystalline semiconductor wafer, such that said regions achieving a fourth dopant concentration become buried regions of said second conductivity type beneath said regions achieving a third dopant concentration, wherein said fourth concentration is higher than said third concentration.

6. A process for simultaneously fabricating three wells of the same conductivity type but different characteristics in the same monocrystalline semiconductor wafer, said process comprising the steps of:

introducing a dopant of a first conductivity type from a surface of said semiconductor wafer to form first, second and third regions of said first conductivity type at said surface of said semiconductor wafer, said first, second and third regions being physically isolated from each other;

introducing a dopant of said first conductivity type from said surface of said semiconductor wafer to form in said second and third regions, respectively, fourth and fifth regions of said first conductivity type;

introducing a dopant of a second conductivity type to form a first set of isolation regions between said first, second and third regions of said first conductivity type;

growing an epitaxial layer on said surface of said semiconductor wafer, such that said first, second, third, fourth, fifth regions of said first conductivity type, and said isolation regions of said second conductivity type become buried regions of said semiconductor wafer; and introducing a dopant of said first conductivity type from said surface of said semiconductor wafer into said epitaxial layer to form a sixth region, a seventh region and an eighth region of said first conductivity type, said sixth, seventh and eighth regions being located, respectively, above said first, fourth and fifth regions, wherein said fourth region is located between, but not enclosed by, said second and seventh regions and further wherein said fifth region is enclosed by said third and eighth regions.

7. A process as in claim 6, further comprising the step of introducing into said epitaxial layer dopant of said second conductivity type to form a second set of isolation regions, said second set of isolation regions being located between said sixth, seventh and eighth regions.

8. A process as in claim 7, wherein said step of introducing into said epitaxial layer dopant of said second conductivity type to form a second set of isolation regions is performed prior to said step of introducing dopant of said first conductivity type into said epitaxial layer to form said sixth, seventh and eighth regions, wherein a mask defining locations of said second set of isolation regions defines also locations of said sixth, seventh and eighth regions.

9. A process as in claim 7, wherein said step of introducing into said epitaxial layer dopant of said second conductivity type to form a second set of isolation regions is performed after said step of introducing dopant of said first conductivity type into said epitaxial layer to form said sixth, seventh and eighth regions, and wherein a mask defining locations of said sixth, seventh and eight regions defines locations of said second set of isolation regions.

* * * * *